(12) United States Patent
Pfeifer et al.

(10) Patent No.: US 9,411,555 B2
(45) Date of Patent: Aug. 9, 2016

(54) SYSTEMS AND METHODS FOR CREATING CONTEXT SENSITIVE GRAPH TOPOLOGIES BASED ON MULTIDIMENSIONAL CONTEXT INFORMATION

(71) Applicant: SAP AG, Walldorf (DE)

(72) Inventors: Wolfgang Pfeifer, Kerzenheim (DE); Matthaeus Martynus, Mannheim-Friedrichsfeld (DE); Buenyamin Eskiocak, Wiesloch (DE); Alexander Straubach, Walldorf (DE)

(73) Assignee: SAP SE, Walldorf (DE)

( * ) Notice: Subject to any disclaimer, the term of this patent is extended or adjusted under 35 U.S.C. 154(b) by 548 days.

(21) Appl. No.: 13/645,135

(22) Filed: Oct. 4, 2012

(65) Prior Publication Data

US 2014/0100840 A1    Apr. 10, 2014

(51) Int. Cl.
| | |
|---|---|
| *G06F 7/60* | (2006.01) |
| *G06F 17/10* | (2006.01) |
| *G06F 9/44* | (2006.01) |
| *G06F 17/30* | (2006.01) |
| *G06F 17/50* | (2006.01) |

(52) U.S. Cl.
CPC ............ *G06F 8/10* (2013.01); *G06F 17/30651* (2013.01); *G06F 17/30958* (2013.01); *G06F 17/50* (2013.01)

(58) Field of Classification Search
CPC ............. G06F 17/50; G06F 17/30651; G06F 17/30958; G06F 8/10; G06F 17/30961
USPC .......................... 703/2, 22; 707/803; 717/104
See application file for complete search history.

(56) References Cited

U.S. PATENT DOCUMENTS

| | | | |
|---|---|---|---|
| 2005/0262470 A1* | 11/2005 | Gavrilov | .................. 717/100 |
| 2006/0174170 A1* | 8/2006 | Garland | .............. G06F 11/3688 714/57 |
| 2011/0087708 A1* | 4/2011 | Teichmann | ............. G06Q 10/10 707/803 |

OTHER PUBLICATIONS

Jouault, Frederic et al., "KM3: A DSL for Metamodel Specification", 2006, IFIP International Federation for Information Processing.*
Binz, Tobias et al., "Improving the Manageability of Enterprise Topologies through Segmentation, Graph Transformation, and Analysis Strategies", 2012, IEEE 16th International Enterprise Distributed Object Computing Conference, IEEE Computer Society.*

(Continued)

*Primary Examiner* — Cedric D Johnson
(74) *Attorney, Agent, or Firm* — Fountainhead Law Group PC

(57) ABSTRACT

In one embodiment, a computer-implemented method comprises receiving a first user instruction in a controller. The controller stores information about a first plurality of metaquarks and a first graph topology creating expression. The method further includes generating, by the controller, an original graph topology based on the first plurality of metaquarks and the first graph topology creating expression and the first user instruction, and generating first display information based on the original graph topology. The method may further comprise receiving a second user instruction in the controller; generating a second plurality of metaquarks and a second graph topology creating expression based on the second user instruction; generating, by the controller, a modified graph topology based on the first plurality of metaquarks, the second plurality of metaquarks, and the second graph topology creating expression; and generating second display information based on the modified graph topology.

14 Claims, 8 Drawing Sheets

(56) References Cited

OTHER PUBLICATIONS

Fayet, V. et al., "Hop-by-Hop Routing with Node-Dependent Topology Information", 1999, IEEE.*

Larson, P.A. et al., "A File Structure Supporting Traversal Recursion", 1989, ACM.*

Naor, Moni et al., "Novel Architectures for P2P Applications: The Continuous-Discrete Approach", Aug. 2007, ACM Transactions on Algorithms, vol. 3, No. 3, ACM.*

OMG's MetaObject Facility, retrieved from: http://www.omg.org/mof/ Printed Aug. 22, 2012.

Eclipse Modeling Framework Project (EMF); retrieved from: http://www.eclipse.org/modeling/emf/ Printed Aug. 22, 2012.

Erik Thomsen. (1997). OLAP Solutions: Building Multidimensional Information Systems, 2nd Edition. John Wiley & Sons. ISBN 978-0-471-14931-6.

* cited by examiner

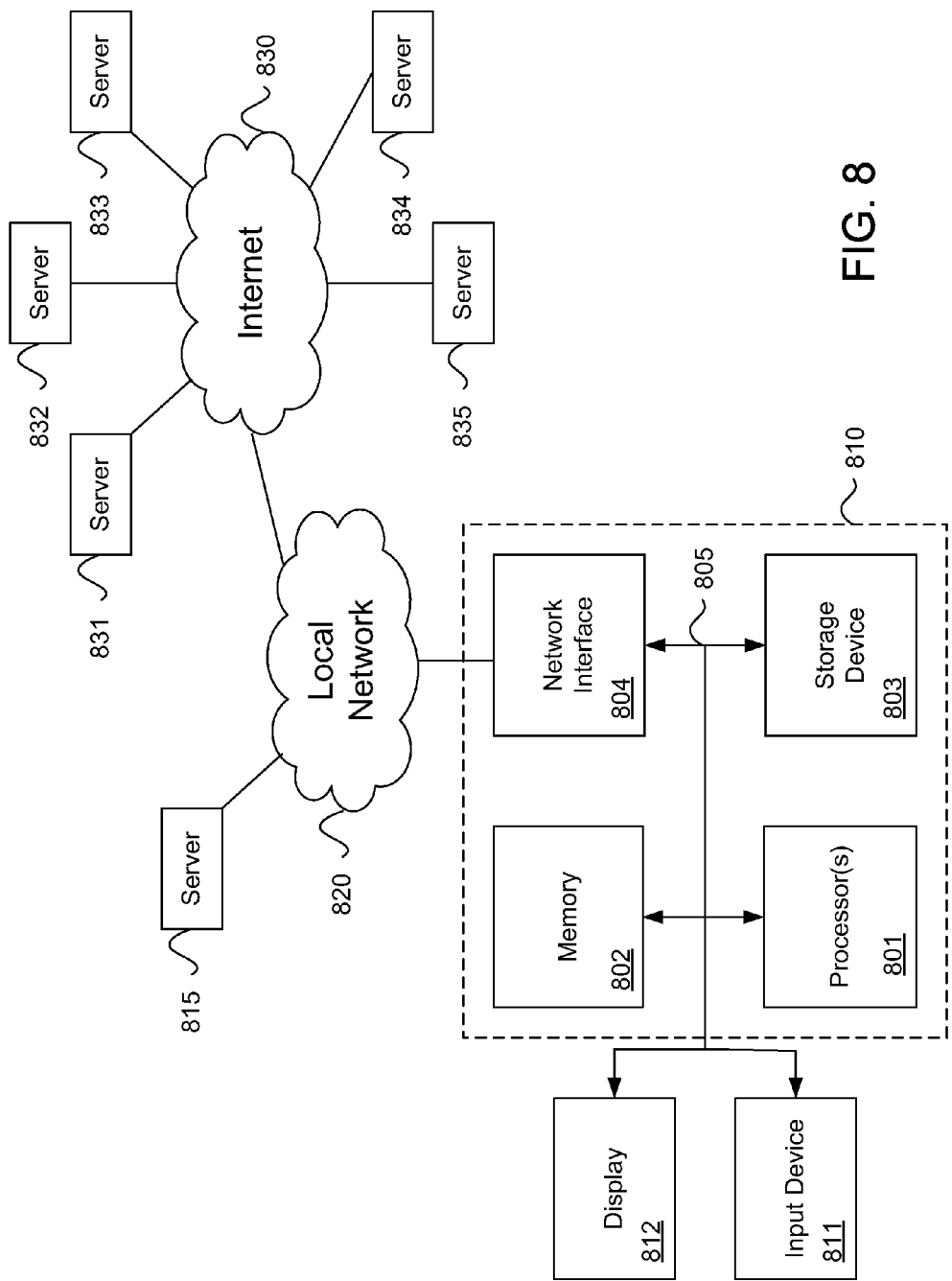

SYSTEMS AND METHODS FOR CREATING CONTEXT SENSITIVE GRAPH TOPOLOGIES BASED ON MULTIDIMENSIONAL CONTEXT INFORMATION

BACKGROUND

The present invention relates to computing, and in particular, to systems and methods for creating context sensitive graph topologies based on multidimensional context information.

Software engineers use model driven approaches in designing and implementing software solutions. For example, the MetaObject Facility standard by Object Management Group, Inc. and the Eclipse Modeling Framework standard by the Eclipse Foundation are used to create design tools and repository frameworks. These standards are graph based and use nodes and associations in conjunction with atomic attributes to describe a set of entities, compose an application or technical domain, or align a set of these domains. In these standards, these artifacts are created and stored, as they are produced, as fully instantiated graphs, stored in a corresponding repository infrastructure. These standards provide a solution for a static and individual set of domain problems to which the standards are directed. However, the persistency of complex graphs and multiple replications of these standards significantly inhibit efficient changes and modifications to the graph.

One conventional approach for solving these issues is creating extremely complex graphs that try to include every possible attribute to attempt to avoid missing any specific subset projection. However, this approach requires significant upfront investment for graph creation by trying to include all known elements into the definition of the model and by excluding, in a specialization step of a subtractive projection, all unnecessary elements from the given graph to produce a presentation of the graph fitting the required structure in the specific context. Further, the elements required in this context may not exist in the upfront created graph and thus need to be added. This addition is usually a very time consuming and complex task requiring changes of the originally delivered objects, which causes conflicts with software delivery and distribution mechanisms used in the context of the given solution and environment (e.g., production landscape at the customer site or in an on-demand environment).

Additionally, different consumers might want to change the original graphs in different and sometimes conflicting ways. Conflicts may occur when the changes are managed by applying them to shared instances (e.g. in hosted or on-demand environments) by different customers. For example, conflicts may occur in systems where the changes need to be kept isolated and invisible between the different consumers. Nevertheless consumers want to reuse the originals in a shared manner, to save time for implementation. Conventional systems create a complete copy of the shared, public original graph (e.g., a replicate) in the private consumer context, which decouples the copy immediately from any future change management of the original. Furthermore, a large part of the original graph might remain unchanged depending on the amount of changes to be applied. This may create a significant number of useless or unused graph elements that increases the number of elements that are processed during reconciliation, original to copy comparison, and original to copy adjustment.

One problem with associated with this approach is that, for isolated customer environments, original graphs delivered by the various platform providers must be kept in sync with locally applied changes and limits the ability to adopt changes. In cloud based environments, customer solutions are run in virtualized runtimes, for efficiency reasons, from the website of the platform providers. Large numbers of customers share the same content and can adapt the content to their individual needs. It is generally desirable for customers to adapt the existing originals based on their provided capabilities, share them with their customers or partners of choice for conducting business and allowing the customers to handle their delivery like the shared content delivered by the platform provider. However, because the original graph is synced among various isolated customers, the platform provider of the original graph cannot make changes to the original platform without changing the locally applied changes. Consequently, there exists a need for improved systems and methods for creating context sensitive based graph topologies. The present invention addresses this problem, and others, by providing systems and methods for creating context sensitive graph topologies based on multidimensional context information.

SUMMARY

Embodiments of the present invention include systems and methods for creating context sensitive graph topologies based on multidimensional context information. In one embodiment, the present invention includes a computer-implemented method comprising receiving a first user instruction in a controller, wherein the controller stores information about a first plurality of metaquarks and a first graph topology creating expression, wherein a data store stores the first plurality of metaquarks and the first graph topology creating expression. The method further includes generating, by the controller, an original graph topology based on the first plurality of metaquarks and the first graph topology creating expression and the first user instruction, and generating first display information based on the original graph topology.

In one embodiment, the first metaquarks include a plurality of context dimensions.

In one embodiment, the method further comprises receiving a second user instruction in the controller; generating a second plurality of metaquarks and a second graph topology creating expression based on the second user instruction; generating, by the controller, a modified graph topology based on the first plurality of metaquarks, the second plurality of metaquarks, and the second graph topology creating expression; and generating second display information based on the modified graph topology.

In one embodiment, generating a second plurality of metaquarks and a second graph topology creating expression is after generating a first plurality of metaquarks and a first graph topology creating expression.

In one embodiment, the second metaquarks include a plurality of context dimensions.

In one embodiment, one of the context dimensions identifies whether the corresponding metaquark is to be added or subtracted from the modified graph topology.

In one embodiment, the plurality of second metaquarks includes at least one of the first metaquarks.

In one embodiment, the first graph topology is a first database table, the second graph topology is a second database table, the first metaquark represents a column of the first database table, and the second metaquark represents a column of the second database table.

In one embodiment, generating a second graph topology includes generating the second graph topology if the second user request is a request to access the second graph topology.

In one embodiment, the method further comprises generating a consumption instance in response to a first metaquark or second metaquark being accessed.

In another embodiment, the present invention includes a computer readable medium embodying a computer program for performing a method and embodiments described above.

In another embodiment, the present invention includes a computer system comprising one or more processors implementing the techniques described herein. For example, the system includes a controller receives a first user instruction. The controller stores information about a graph topology. A data store stores the first plurality of metaquarks and the first graph topology creating expression. The controller generates an original graph topology based on the first plurality of metaquarks and the first graph topology creating expression and the first user instruction, and generates first display information based on the original graph topology.

In one embodiment, the controller further receives a second user instruction in the controller, generates a second plurality of metaquarks and a second graph topology creating expression based on the second user instruction; generates a modified graph topology based on the first plurality of metaquarks, the second plurality of metaquarks, and the second graph topology creating expression, and generates second display information based on the modified graph topology The following detailed description and accompanying drawings provide a better understanding of the nature and advantages of the present invention.

BRIEF DESCRIPTION OF THE DRAWINGS

FIG. 8 illustrates hardware used to implement embodiments of the present invention.

DETAILED DESCRIPTION

Described herein are techniques for creating context sensitive graph topologies based on multidimensional context information. The apparatuses, methods, and techniques described below may be implemented as a computer program (software) executing on one or more computers. The computer program may further be stored on a computer readable medium. The computer readable medium may include instructions for performing the processes described below. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
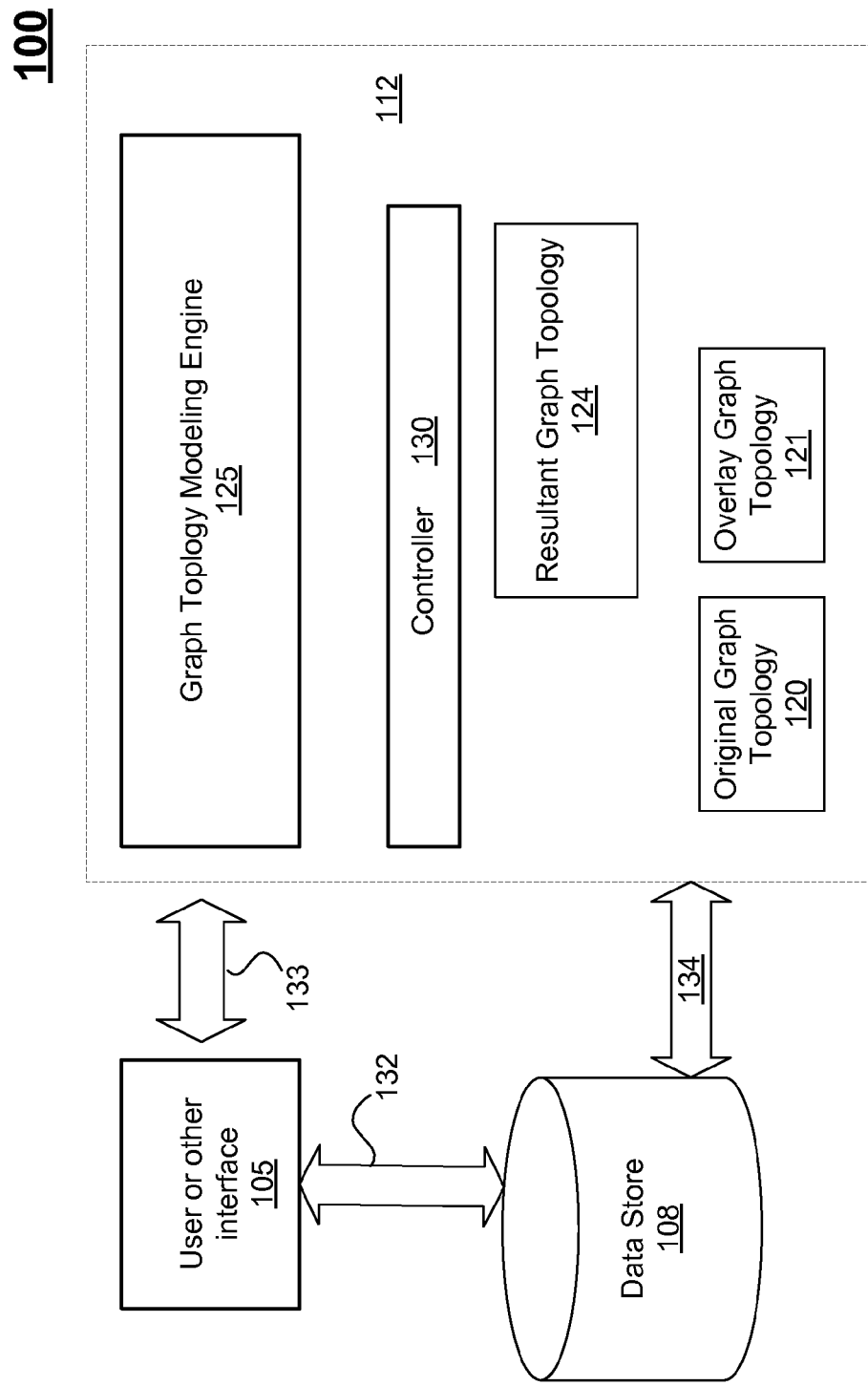
FIG. 1 is a schematic representation of a system for creating context sensitive graph topologies based on multidimensional context information according to an embodiment of the present invention.

FIG. 1 is a schematic representation of a system 100 for creating context sensitive graph topologies based on multidimensional context information according to an embodiment of the present invention. System 100 includes a user or other interface 105, a data store 108, and a graph topology modeling system 112. In the following description, the term "data store" is used interchangeably with "database." Data store 108 may comprise one or more data stores. Graph topology modeling system 112 comprises an original graph topology 120, an overlay graph topology 121, a resultant graph topology 124, a graph topology modeling engine 125, and a controller 130.

Information is conveyed between user interface 105, data store 108, and graph topology modeling system 112, along data flow paths 132, 133, and 134. For example, graph topology modeling system 112 accesses the contents of database 108 over data flow path 134 when generating a user interface with practically boundless canvas and zoom capabilities.

Original graph topology 120 and overlay graph topology 121 are sets of data that are stored in database 108 and accessed by graph topology modeling system 112. In various embodiments, original graph topology 120 and overlay graph topology 121 include data stored as elements that are used for forming graph topologies and graph table creation expressions. In various embodiments, the elements are metaquarks. As used herein, the term "metaquark" refers to a granular element that is used as a building block of a graph topology. As an illustrative example of a column based memory system, the metaquark may be a column definition. Metaquarks are described below in conjunction with FIGS. 2-3. By way of illustration, graph topologies may be flat structures and table descriptions, stars, trees, or networks. Every graph topology instance is assigned to one or more graph table creation expressions.

Original graph topology 120 stores data for the graph topology of a software application that is used to generate a graph, which may be displayed on user interface 105. In some embodiments, the original graph topology includes an original graph topology. Original graph topology 120 is one or more instances of graph topologies controlled by somebody other than the currently active user who will be adapting the original graph topology based on the user requests.

Overlay graph topology 121 stores data for the overlay or changes to the original graph topology that is used to generate a graph that may be displayed on user interface 105. Graph topology modeling engine 125 executes a process or algorithm that analyzes data from original graph topology 120 and overlay graph topology 121 and generates resultant graph topology 124 based on the analysis. In various embodiments, original graph topology 120 is not changed by the user. Instead, changes are made using overlay graph topology 121 to create additional graph topology instances. In various embodiments, the additional graph topology instance is of the same type as the original graph topology instance, and is tagged as extension of the original. The extension is an incremental overlay to the original allowing the addition of new metaquarks to or subtraction of existing metaquarks from an existing graph topology instance. In various embodiments, extension overlays are always read and accessed together with the original that they belong to.

User or other interface 105 is a collection of one or more data input/output devices for interacting with a human user or with another data processing system to receive and output data. For example, interface 105 can be a presentation system, one or more software applications, or a data communications gateway, for example. Data flow path 132 is data communicated over interface 105 that retrieves data from or causes a change to data stored in database 108. Such changes include the insertion, deletion, or modification of all or a portion of the contents of database 108. Data output over interface 105 can present the results of data processing activities in system 100. For example, data flow path 133 can convey the results of queries or other operations performed on graph topology modeling system 112 for presentation on a monitor or a data communications gateway.

Data store 108 is a collection of information that is stored at one or more data machine readable storage devices (e.g., data stores). Data store 108 may be a single data store or multiple data stores, which may be coupled to one or more software applications for storing application data. Data store 108 may store data as a plurality of data records. Each data record comprises a plurality of data elements (e.g., fields of a record). Data store 108 may include different structures and their relations (e.g., data store tables, data records, fields, and foreign key relations). Additionally, different structures and fields may include data types, descriptions, or other metadata, for example, which may be different for different data records. Data store 108 may store data used for original graph topology 120, overlay graph topology 121, and resultant graph topology 124. Data flow path 134 conveys information describing changes to data stored in data store 108 between graph topology modeling system 112 and data store 108. Such changes include the insertion, deletion, and modification of all or a portion of the contents of one or more data stores.

Graph topology modeling system 112 is a collection of data processing activities (e.g., one or more data analysis programs or methods) performed in accordance with the logic of a set of machine-readable instructions. The data processing activities can include running instructions, such as user requests, on the contents of data store 108. The results of such queries can be aggregated to yield an aggregated result set, which may be a graph topology. Although a graph topology may be stored and later retrieved, various embodiments are described herein in which graph topology modeling engine 125 calculates a graph topology when the graph topology is accessed or read. The instructions can be, for example, to navigate, modify or create a graph or elements thereof. The result of the instruction can be conveyed to interface 105 over data flow path 133. Interface 105 can, in turn, render the result over an output device for a human or other user or to other systems. This output of result drawn from graph topology modeling system 112, based on data from data store 108, allows system 100 to accurately portray the graph.

Instructions from the graph topology modeling engine 125 or the user interface 105 may be received by controller 130. Controller 130 may be a component on the same system as a data store or part of a different system and may be implemented in hardware, software, or as a combination of hardware and software, for example. Controller 130 receives an instruction from graph topology modeling engine 125 and generates one or more requests based on the received instruction depending on the data stores 108 and data sets that are to be accessed. Data store 108 transforms the request from controller 130 into an appropriate syntax compatible with the data store.

Controller 130 receives data from data store 108. In responding to the instruction from graph topology modeling engine 125, controller 130 may aggregate the data (e.g., metaquarks) of the data sets from data store 108. Controller 130 returns the aggregated data to graph topology modeling engine 125 in response to the instruction and based on one or more graph topology creation expressions. Because every graph topology instance is assigned to one or more graph table creation expressions, when a user accesses a graph topology instance, the user is identifying which type of topology that is desired as a result. Accordingly, graph topology modeling engine 125 may identify the related graph topology creation expressions and execute them at the access time to produce the desired topology.

In some embodiments, system 100 is used in any application that includes a significant number of application items related to each other, or within the context of the user's specific objective, the users enterprise or business network, or the user in general. System 100 may be used in applications having relationships between the elements along a certain dimension that are in a hierarchical or network pattern. System 100 may be used in various application domains, such as supply chain visibility, resource planning, human capital management, goal management, customer relationship management, or process control systems.

System 100 generates graph topologies from a set of elements, such as metaquarks, using an additive process that adds or subtracts metaquarks from the set of elements. System 100 may produce model instances from different domains based on a user request. System 100 may use a metaquark for many graph topology instances.

Figure 2:
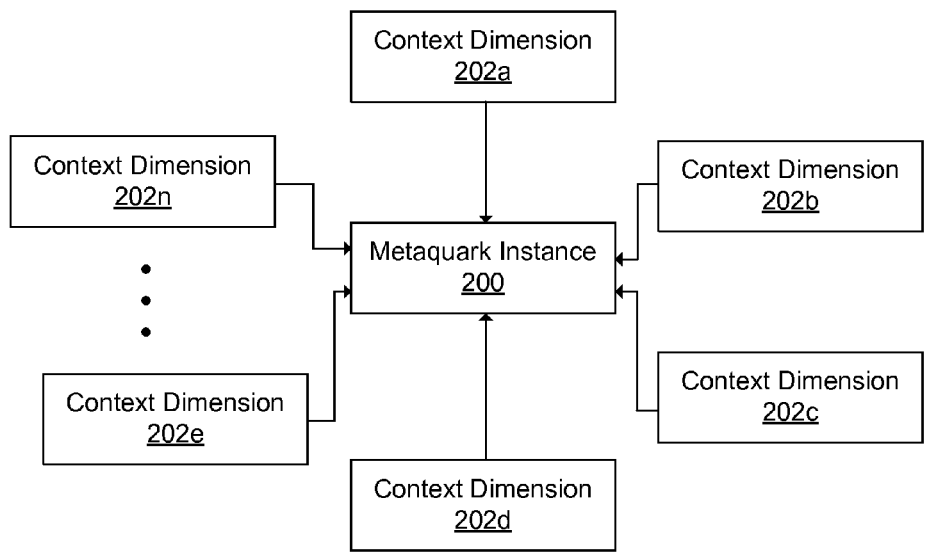
FIG. 2 is a schematic representation of a metaquark instance of a graph topology formed using the system of FIG. 1.

FIG. 2 is a schematic representation of a metaquark instance 200 of a graph topology formed using system 100. Metaquark instance 200 includes a plurality of context dimensions 202a through 202n. Graph topology modeling system 112 uses the context dimensions 202 to separate content in various environments. One environment is a sharing environment in which commonly used model elements are shared among users. Another environment is an isolation environment in which individual or group elements are used by the individual or group, but other users are not allowed access to these elements.

A metaquark instance can be used in different graph topology creation expressions at the same time. For example, one column definition may be part of a database table definition in one graph topology creation expression, and, at the same time, the column definition may used to compose a proxy interface allowing an access method to access the data stored in the table created accordingly to the database table definition.

As noted above, in various embodiments, the created graph is not stored, but the metaquarks and graph topology creation expression for creating the graph are stored. Accordingly, graph topology modeling engine 125 creates or renders every graph instance at the time the graph is accessed. Thus, changes to the metaquarks and the graph topology creation expression may be made, and the changes are implemented the next time the graph is accessed.

In various embodiments, graph topology modeling engine 125 creates a consumption instance in response to a usage of a metaquark 200 in a topology. The consumption instance includes an identification indication or value of the consuming topology or topology fragment (such as a predecessor).

Figure 3:
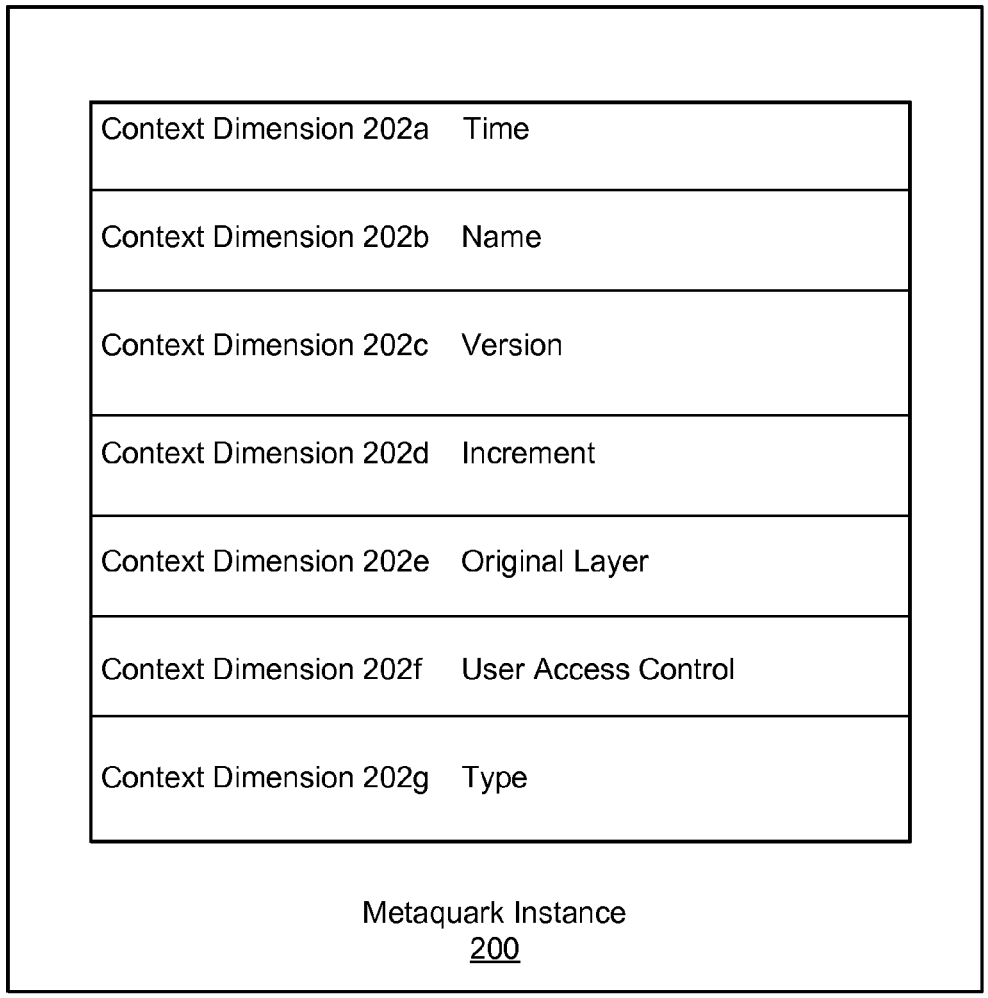
FIG. 3 is a schematic representation of an example metaquark instance formed using the system of FIG. 1.

FIG. 3 is a schematic representation of an example of metaquark instance 200. Although only seven content dimensions 202 are described, metaquark instance 200 may include any number of dimensions. Content dimension 202a indicates a time of the content of metaquark instance 200. The time may be, for example, a timestamp of creation of the content or a timestamp of a change of the content. Content dimension 202b indicates the name of the content of metaquark instance 200. Content dimension 202b may include a description, such as a text description, of the content or language identification of the content.

Content dimension 202c indicates the version of the content of metaquark instance 200. Content dimension 202d indicates the increment or change in the content of metaquark instance 200. For example, the increment may be an addition or subtraction of a metaquark. Content dimension 202e indicates the identification of the original software layer of the content of metaquark instance 200. Content dimension 202f indicates the user access control (e.g., password) of the content of metaquark instance 200. Content dimension 202g indicates the type of content of metaquark instance 200.

The context dimensions 202 form a multidimensional context cube of the metaquark instance 200. The data in the cube cells are the identifying values of metaquark instances.

Figure 4:
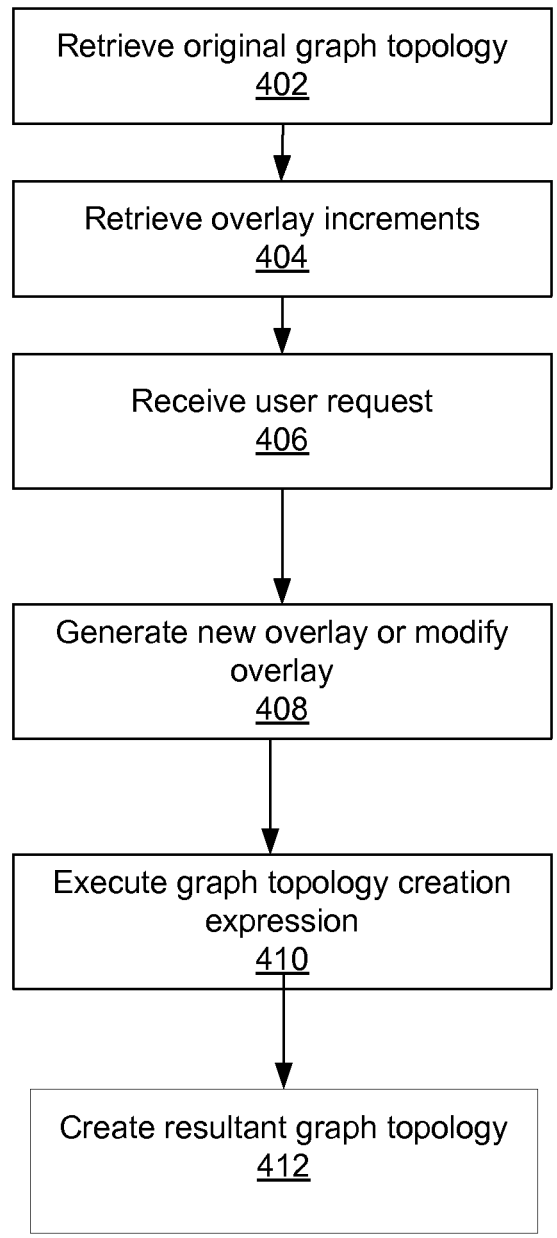
FIG. 4 illustrates a process for generating a graph topology according to an embodiment of the present invention.

FIG. 4 illustrates a process for generating a graph topology according to an embodiment of the present invention. At 402, graph topology modeling engine 125 retrieves original graph topology 120.

Figure 5:
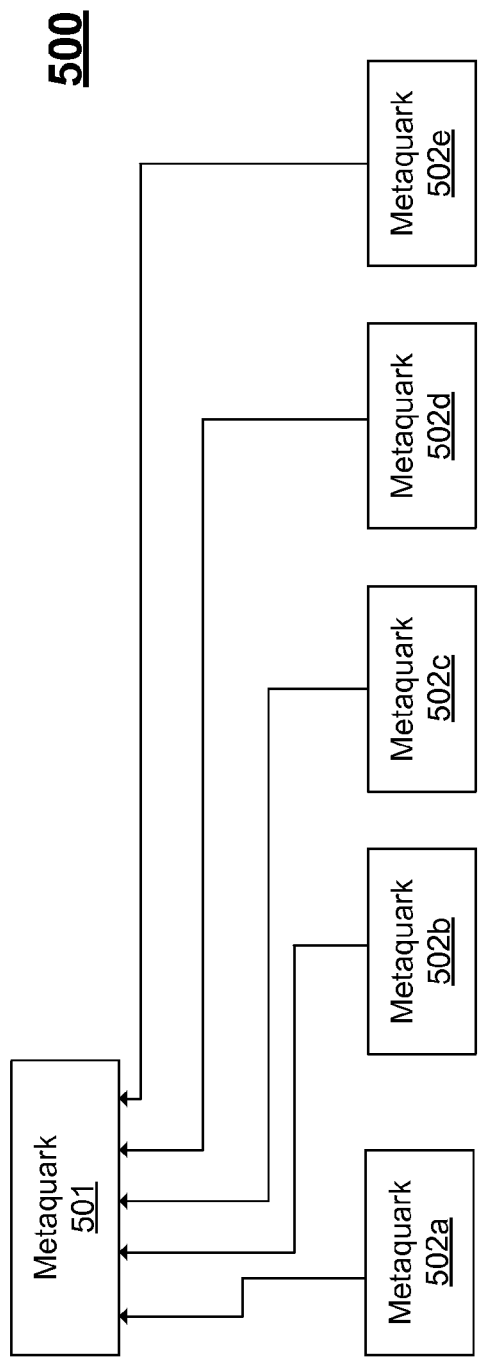
FIG. 5 is a schematic representation of an example original graph topology.

FIG. 5 is a schematic representation of an example original graph topology 500. Original graph topology 500 comprises a metaquark 501 and a plurality of metaquarks 502a through 502e. Metaquark 501 defines the relationships between metaquarks 502a through 502e for the original graph topology 500. Metaquark 501 and metaquarks 502a through 502e are illustrative examples of metaquark 200 (see FIG. 2).

Referring again to FIG. 4, at 402, graph topology modeling engine 125 retrieves metaquark 501 and metaquarks 502a through 502e as an illustrative example. At 404, graph topology modeling engine 125 retrieves overlay increments of overlay graph topology 121.

Figure 6:
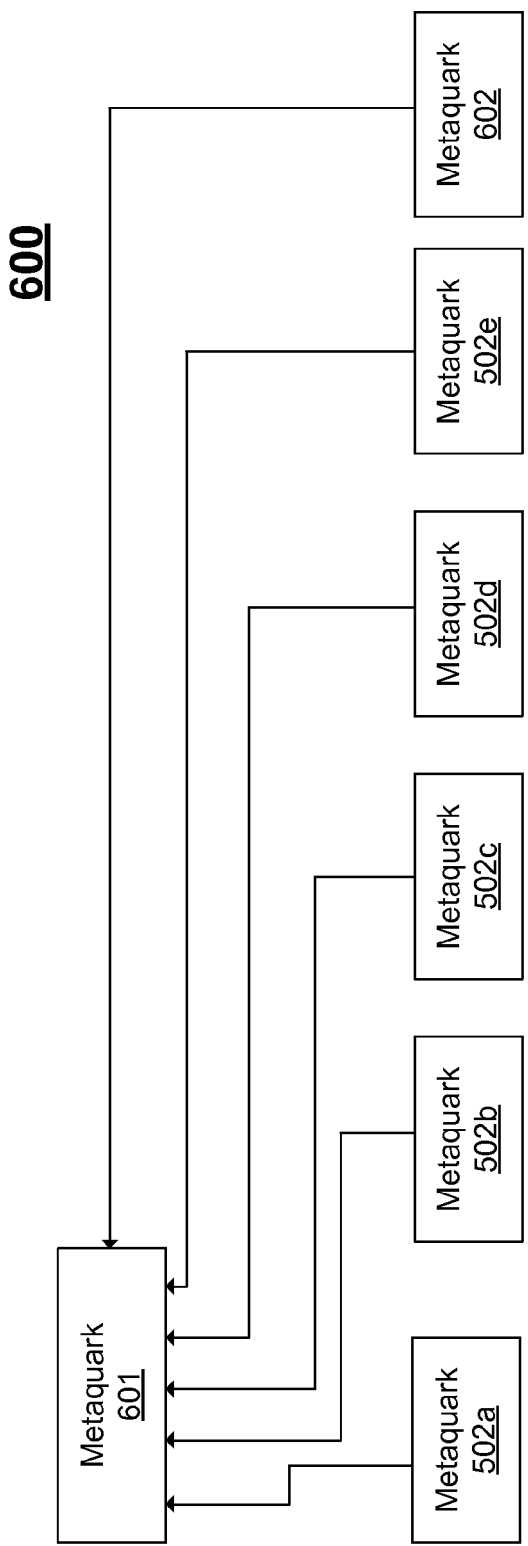
FIG. 6 is a schematic representation of a first example modified graph topology.

FIG. 6 is a schematic representation of an example modified graph topology 600. Modified graph topology 600 comprises a metaquark 601, the plurality of metaquarks 502a through 502e, and a metaquark 602. Metaquark 601 defines the relationships between metaquarks 502a through 502e and metaquark 602 for the modified graph topology 600. Metaquarks 601 and metaquark 602 are illustrative examples of metaquark 200 (see FIG. 2). In modified graph topology 600, the user had modified original graph topology 500 (see FIG. 5) by including an additional metaquark, namely metaquark 602, to the graph topology.

Referring again to FIG. 4, at 404, graph topology modeling engine 125 retrieves metaquark 601, metaquark 602, and metaquarks 502a through 502e as an illustrative example. At 406, graph topology modeling engine 125 receives a user request to change the graph topology, such as create new changes or modify previous changes. At 408, graph topology modeling engine 125 generates new overlays or modifies the previous overlay increments based on the user request. The metaquarks from original graph topology 120 and the modified graph topology 121 are combined in a cumulative way depending on the method of incrementing (e.g., addition or subtraction). This combination provides an additive approach for generating the graph topology.

Figure 7:
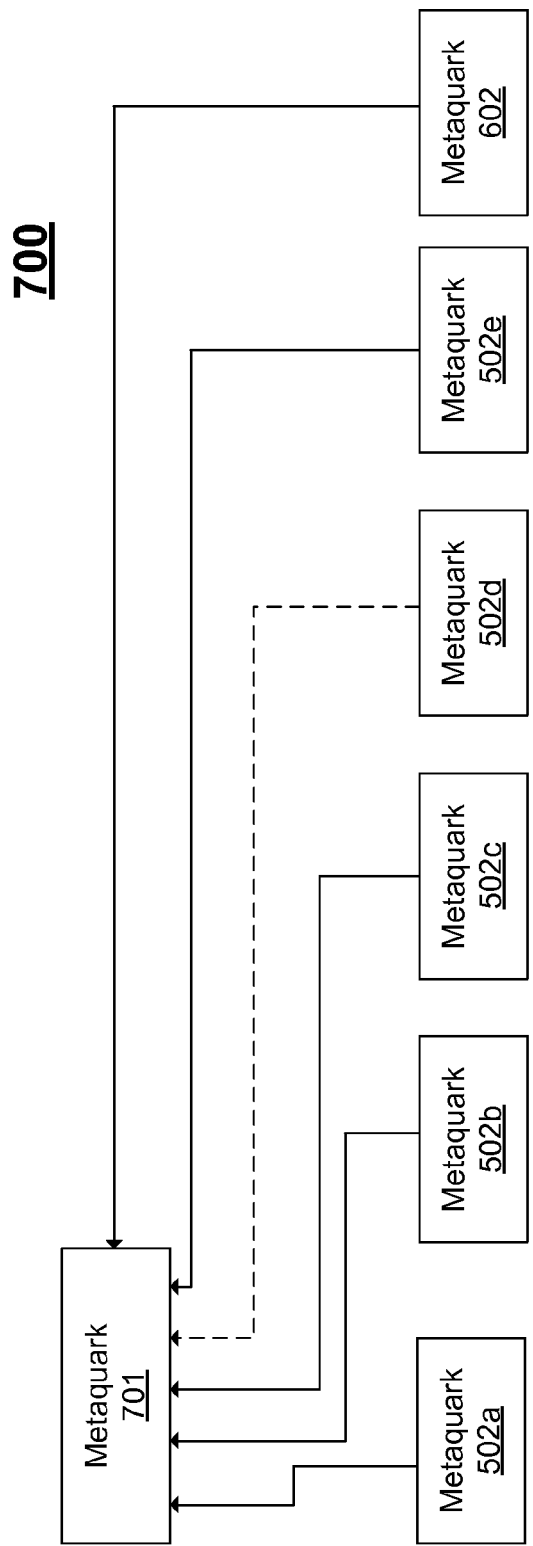
FIG. 7 is a schematic representation of a second example modified graph topology.

FIG. 7 is a schematic representation of an example modified graph topology 700. Modified graph topology 700 comprises a metaquark 701, the plurality of metaquarks 502a through 502e, and a metaquark 602. Metaquark 701 defines the relationships between metaquarks 502a through 502e and metaquark 602 for the modified graph topology 700. In modified graph topology 700, the user is modifying modified graph topology 600 (see FIG. 6) by deleting metaquark 502d from the graph topology.

Referring again to FIG. 4, at 410, graph topology modeling engine 125 executes one or more graph topology creation expressions. In some embodiments, graph topology creation expressions are based on other graph topology creation expressions to create complex, nested graph structures. At 412, graph topology modeling engine 125 generates resultant graph topology 124 based on the executed graph topology creation expressions. As an illustrative example, the graph topology may have a structure of a specific database table that is created by aggregating a specific set of metaquarks in a list manner.

Graph topology modeling engine 125 queries the context cube of the metaquarks with a certain set of parameter values describing the current context. The query returns a set of metaquark identifiers, which graph topology modeling engine 125 uses to instantiate the desired graph topology instance. If the parameters of the query (context) vary, the graph topology instance might look different. Further, graph topology modeling engine 125 may use the metaquarks for instantiation of historic versions of graph topology instances or fine granular user access control.

Conflicts between the original graph topology and the overlay increments may be reduced by creating, for every overlay increment, a syntactically correct graph topology instance together with the original graph topology instance and all subsequent and applicable older overlay increments. Graph topology modeling engine 125 or manual intervention may resolve semantic conflicts that are syntactically correct.

System 100 may create very flexible repository infrastructure components allowing a much more efficient handling and production of graph topology instances for model content. System 100 may reduce the upfront investment for content creation, reduce the repository footprint, ease the distribution process, and change management by enabling a much higher degree of flexibility at the consumer site (such as development partners or customers).

Although system 100 is described for graph topologies, the system 100 may be used for other structures or for describing behavior.

FIG. 8 illustrates hardware used to implement embodiments of the present invention. An example computer system 810 is illustrated in FIG. 8. Computer system 810 includes a bus 805 or other communication mechanism for communicating information, and one or more processors 801 coupled with bus 805 for processing information. Computer system 810 also includes a memory 802 coupled to bus 805 for storing information and instructions to be executed by processor 801, including information and instructions for performing the techniques described above, for example. This memory may also be used for storing variables or other intermediate information during execution of instructions to be executed by processor 801. Possible implementations of this memory may be, but are not limited to, random access memory (RAM), read only memory (ROM), or both. A machine readable storage device 803 is also provided for storing information and instructions. Common forms of storage devices include, for example, a non-transitory electromagnetic medium such as a hard drive, a magnetic disk, an optical disk, a CD-ROM, a DVD, a flash memory, a USB memory card, or any other medium from which a computer can read. Storage device 803 may include source code, binary code, or software files for performing the techniques above, for example. Storage device 803 and memory 802 are both examples of non-transitory computer readable mediums.

Computer system 810 may be coupled via bus 805 to a display 812, such as a cathode ray tube (CRT) or liquid crystal display (LCD), for displaying information to a computer user. An input device 811 such as a keyboard and/or mouse is coupled to bus 805 for communicating information and command selections from the user to processor 801. The combination of these components allows the user to communicate with the system, and may include, for example, user interface 105. In some systems, bus 805 may be divided into multiple specialized buses.

Computer system 810 also includes a network interface 804 coupled with bus 805. Network interface 804 may provide two-way data communication between computer system 810 and the local network 820, for example. The network interface 804 may be a digital subscriber line (DSL) or a modem to provide data communication connection over a telephone line, for example. Another example of the network interface is a local area network (LAN) card to provide a data communication connection to a compatible LAN. Wireless links are another example. In any such implementation, network interface 804 sends and receives electrical, electromagnetic, or optical signals that carry digital data streams representing various types of information.

Computer system 810 can send and receive information, including messages or other interface actions, through the network interface 804 across a local network 820, an Intranet, or the Internet 830. For a local network, computer system 810 may communicate with a plurality of other computer machines, such as server 815. Accordingly, computer system 810 and server computer systems represented by server 815 may be programmed with processes described herein. In the Internet example, software components or services may reside on multiple different computer systems 810 or servers 831-835 across the network. Some or all of the processes described above may be implemented on one or more servers, for example. Specifically, data store 108 and graph topology modeling system 112 or elements thereof might be located on different computer systems 810 or one or more servers 815 and 831-835, for example. A server 831 may transmit actions or messages from one component, through Internet 830, local network 820, and network interface 804 to a component on computer system 810. The software components and processes described above may be implemented on any computer system and send and/or receive information across a network, for example.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A computer-implemented method comprising:
    receiving, by a processor, a user request to modify an original graph topology that includes a plurality of metaquarks and a first metaquark that defines relationships between the plurality of metaquarks, wherein the first metaquark represents a context dimension column of a first database table of a database storing supply chain visibility data, resource planning data, human capital management data, goal management data, customer relationship management data, or process control data;
    first retrieving, by the processor, an overlay graph topology associated with the user request, wherein the overlay graph topology includes a second metaquark representing a context dimension column of a second database table and includes an overlay increment that modifies the original graph topology to create a modified graph topology, the context dimension column of the second database table indicating a password for a user to access content of the second metaquark in an isolation environment not allowing other users to access the content of the second metaquark;
    second retrieving, by the processor, the original graph topology;
    generating, by the processor, a resultant graph topology based on the original graph topology and the overlay graph topology, the resultant graph topology having a structure of a third database table created by aggregating the first metaquark and the second metaquark in a list manner;
    generating display information based on the resultant graph topology;
    rendering the display information to the user;
    receiving input from the user based upon the display information; and
    processing the input to insert, delete, or modify the supply chain visibility data, the resource planning data, the human capital management data, the goal management data, the customer relationship management data, or the process control data.

2. The computer-implemented method of claim 1, further comprising:
    identifying, by the processor, a graph topology creation expression corresponding to the user request.

3. The computer-implemented method of claim 2, wherein the graph topology creation expression was previously applied to the original graph topology.

4. The computer-implemented method of claim 1, wherein the overlay graph topology further includes the plurality of metaquarks and a third metaquark that defines the relationships between the plurality of metaquarks and the overlay increment.

5. The computer-implemented method of claim 1, wherein the overlay increment adds or subtracts a metaquark from the plurality of metaquarks.

6. A non-transitory computer readable storage medium storing one or more programs, the one or more programs comprising instructions for a processor:
    receiving a user request to modify an original graph topology that includes a plurality of metaquarks and a first metaquark that defines relationships between the plurality of metaquarks, wherein the first metaquark represents a context dimension column of a first database table of a database storing supply chain visibility data, resource planning data, human capital management data, goal management data, customer relationship management data, or process control data;
    first retrieving an overlay graph topology associated with the user request, wherein the overlay graph topology includes a second metaquark representing a context dimension column of a second database table and includes an overlay increment that modifies the original graph topology to create a modified graph topology, the context dimension column of the second database table indicating a password for a user to access content of the second metaquark in an isolation environment not allowing other users to access the content of the second metaquark;
    second retrieving the original graph topology based on the password of the user request;
    generating a resultant graph topology based on the original graph topology and the overlay graph topology, the resultant graph topology having a structure of a third database table created by aggregating the first metaquark and the second metaquark in a list manner;
generating display information based on the resultant graph topology;
displaying the display information to the user;
rendering the display information to the user;
receiving input from the user based upon the display information; and
processing the input to insert, delete, or modify the supply chain visibility data, the resource planning data, the human capital management data, the goal management data, the customer relationship management data, or the process control data.

7. The non-transitory computer readable storage medium of claim 6, further comprising:
identifying a graph topology creation expression corresponding to the user request.

8. The non-transitory computer readable storage medium of claim 7, wherein the graph topology creation expression was previously applied to the original graph topology.

9. The non-transitory computer readable storage medium of claim 6, wherein the overlay graph topology further includes the plurality of metaquarks and a third metaquark that defines the relationships between the plurality of metaquarks and the overlay increment.

10. The non-transitory computer readable storage medium of claim 6, wherein the overlay increment adds or subtracts a metaquark from the plurality of metaquarks.

11. A computer implemented system, comprising:
a processor; and
a non-transitory computer readable medium having stored thereon one or more programs, which when executed by the processor, causes the processor to perform the steps of:
receiving a user request to modify an original graph topology that includes a plurality of metaquarks and a first metaquark that defines relationships between the plurality of metaquarks, wherein the first metaquark represents a context dimension column of a first database table of a database storing supply chain visibility data, resource planning data, human capital management data, goal management data, customer relationship management data, or process control data;
first retrieving an overlay graph topology associated with the user request, wherein the overlay graph topology includes a second metaquark representing a context dimension column of a second metadata table and includes an overlay increment that modifies the original graph topology to create a modified graph topology, the context dimension column of the second database table indicating a password for a user to access content of the second metaquark in an isolation environment not allowing other users to access the content of the second metaquark;
second retrieving the original graph topology based on the password of the user request;
generating a resultant graph topology based on the original graph topology and the overlay graph topology, the resultant graph topology having a structure of a third database table created by aggregating the first metaquark and the second metaquark in a list manner;
generating display information based on the resultant graph topology;
displaying the display information to the user;
rendering the display information to the user;
receiving input from the user based upon the display information; and
processing the input to insert, delete, or modify the supply chain visibility data, the resource planning data, the human capital management data, the goal management data, the customer relationship management data, or the process control data.

12. The computer-implemented system of claim 11, further comprising:
identifying a graph topology creation expression corresponding to the user request.

13. The computer-implemented system of claim 12, wherein the graph topology creation expression was previously applied to the original graph topology.

14. The computer-implemented system of claim 11, wherein the overlay graph topology further includes the plurality of metaquarks and a third metaquark that defines the relationships between the plurality of metaquarks and the overlay increment.

* * * * *